United States Patent
Nayfeh et al.

(10) Patent No.: US 9,755,133 B1
(45) Date of Patent: Sep. 5, 2017

(54) RECONFIGURABLE, TUNABLE QUANTUM QUBIT CIRCUITS WITH INTERNAL, NONVOLATILE MEMORY

(71) Applicant: SPAWAR Systems Center Pacific, San Diego, CA (US)

(72) Inventors: Osama M. Nayfeh, San Diego, CA (US); Son Dinh, San Diego, CA (US); Anna Leese de Escobar, San Diego, CA (US); Kenneth Simonsen, San Diego, CA (US); Shahrokh Naderi, Del Mar, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/060,290

(22) Filed: Mar. 3, 2016

(51) Int. Cl.
*H01L 39/22* (2006.01)
*H01L 39/24* (2006.01)
*H01L 39/02* (2006.01)

(52) U.S. Cl.
CPC ......... *H01L 39/223* (2013.01); *H01L 39/025* (2013.01); *H01L 39/2493* (2013.01)

(58) Field of Classification Search
CPC ... H01L 39/22; H01L 39/223; H01L 39/2493; H01L 39/221; H01L 39/025
See application file for complete search history.

(56) References Cited

U.S. PATENT DOCUMENTS

| | | | |
|---|---|---|---|
| 7,135,701 B2 | 11/2006 | Amin et al. | |
| 2005/0098773 A1* | 5/2005 | Vion | G06N 99/002 257/9 |
| 2011/0054876 A1* | 3/2011 | Biamonte | B82Y 10/00 703/15 |
| 2016/0148112 A1* | 5/2016 | Kwon | G06N 99/002 257/31 |
| 2016/0364653 A1* | 12/2016 | Chow | G06N 99/002 |

OTHER PUBLICATIONS

Du, J. et al., "Fabrication and Characterisation of Series YBCO Step-Edge Josephson Junction Arrays", Superconducting Science and Technology, IOP Publishing, vol. 27, pp. 1-7, 2014.
Tolpygo, S, et al., "Fabrication-process-induced variations of NB/Al/AlOx/Nb Josephson junctions in superconductor integrated circuits", Superconductor Science and Technology, IOP Publishing, vol. 24, pp. 1-9, 2010.

(Continued)

*Primary Examiner* — Phuc Dang
(74) *Attorney, Agent, or Firm* — SPAWAR Systems Center Pacific; Kyle Eppele; J. Eric Anderson

(57) ABSTRACT

A tunable quantum qubit circuit comprising: a plurality of interconnected Josephson tunneling junctions sculpted in-situ on-chip, wherein each Josephson tunneling junction comprises a pair of high temperature superconductors separated by an active region having a controlled charge density; a capacitive-coupled control gate operatively coupled to the Josephson tunneling junctions and configured to simultaneously modulate energy levels of the Josephson tunneling junctions; and independent control gates operatively coupled to the Josephson tunneling junctions, wherein the independent control gates are reconfigurable on-the-fly by an operator.

10 Claims, 8 Drawing Sheets

(56) References Cited

OTHER PUBLICATIONS

Stewart, W.C., "Current-Voltage Characteristics of Josephson Junctions", Applied Physics Letters, vol. 12, No. 8, pp. 277-280, Apr. 1968.

Gheewala, Tushar, "The Josephson Technology", Proceedings of the IEEE, vol. 70, No. 1, pp. 26-34, Jan. 1982.

Clement, P.-Y. et al., "Double barrier magnetic tunnel junctions with write/read mode select layer", 2014 IEEE 6th International Memory Workshop, Tapei, Taiwan, pp. 1-4, May 18-21, 2014.

Baek, B. et al., "Magnetic barrier structures for superconducting-magnetic hybrid Josephson junctions", 2013 IEEE 14th International Superconductive Electronics Conference, Cambridge, MA, pp. 1-3, Jul. 7-11, 2013.

Holmes, D.S. et al., "Energy-Efficient Superconducting Computing—Power Budgets and Requirements," IEEE Transactions on Applied Superconductivity, vol. 23, No. 3, Jun. 2013.

Harris, R. et. al, "Experimental investigation of an eight-qubit unit cell in a superconducting optimization processor," Phys. Rev. B, vol. 82, 024511, 2010.

Mukhanov, O. A., "Energy-efficient Single Flux Quantum technology," IEEE Trans. Appl. Supercond., Jun. 21, 2011.

Nayfeh, O.M. et. al "Memory effects in metal-oxide-semiconductor capacitors incorporating dispensed highly monodisperse 1 nm silicon nanoparticles," Applied Physics Letters, vol. 90, No. 15, Apr. 2007.

Berggren, S. et. al, "Development of 2-D Bi-SQUID Arrays With High Linearity," IEEE Transactions on Applied Superconductivity, vol. 23, No. 3, Jun. 2013.

Mitchell, E.E. et al., YBCO step-edge junctions with high IcRn, Superconductor Science and Technology, vol. 23, 2010, 065007.

Akaike, H., "Characterization of NbN Tunnel Junctions With Radical-Nitrided AlNx Barriers," IEEE Transactions on Applied Superconductivity, vol. 23, No. 3, Jun. 2013.

Satoh, K. et al., "Fabrication Process of Planarized Multi-Layer Nb Integrated Circuits," IEEE Transactions on Applied Superconductivity, vol. 15, No. 2, Jun. 2005.

Kerber, G. et al., "Fabrication of High Current Density Nb Integrated Circuits Using a Self-Aligned Junction Anodization Process," IEEE Transactions on Applied Superconductivity, vol. 13, No. 2, Jun. 2003.

Meckbach, J.M. et al., "Sub-urn Josephson Junctions for Superconducting Quantum Devices," IEEE Transactions on Applied Superconductivity, vol. 23, No. 3, Jun. 2013.

Chen, K. et al., "High-Jc MgB2 Josephson junctions with operating temperature up to 40K," Applied Physics Letters, vol. 96, 042506, 2010.

Seto, J. et al., "Supercurrent Tunneling Junctions and Tellurium Barriers," Applied Physics Letters, vol. 19, No. 11, pp. 488-491, Dec. 1971.

Kuprianov, M.Y., et al., "Influence of boundary transparency on the critical current of 'dirty' SS'S structures," Sov. Phys. JETP, vol. 67, No. 6, pp. 1163-1168, Jun. 1988.

Strukov, D.B. et al., "Exponential ionic drift: fast switching and low volatility of thin film memristors," Appl Phys A, vol. 94, pp. 515-519, 2009.

Rose-Innes, A.C. et al., "Superconductivity of Superimposed Metals," Phys. Rev. Lett. Vo. 7, No. 7, 278-279 (1961).

Kleinasser, A.W. et al., "Semiconductor Heterostructure Weak Links for Josephson and Superconducting FET Applications," IEEE Transactions on Magnetics, vol. Mag-23, No. 2, Mar. 1987.

De Escobar, A.L. et al., "High Performance HF-VHF All Digital RF Receiver Tested at 20 GHz Clock Frequencies" Military Communications Conference, 2006. MILCOM 2006, IEEE; Oct. 23-25, 2006.

USPTO; Office Action regarding related U.S. Appl. No. 14/716,629.

\* cited by examiner

US 9,755,133 B1

RECONFIGURABLE, TUNABLE QUANTUM QUBIT CIRCUITS WITH INTERNAL, NONVOLATILE MEMORY

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102561.

CROSS-REFERENCE TO RELATED APPLICATION

This application is related to U.S. application Ser. No. 14/716,629, filed 19 May 2015, titled "Quantum Memory Device and Method" (Navy Case #102361), which application is hereby incorporated by reference herein in its entirety for its teachings. This application is also related to U.S. application Ser. No. 15/030,353, filed 3 Mar. 2016, titled "Advanced Process Flow for Quantum Memory Devices and Josephson Junctions with Heterogeneous Integration" (Navy Case #102933), which application is hereby incorporated by reference herein in its entirety for its teachings.

BACKGROUND OF THE INVENTION

The invention claimed herein relates to the field of quantum circuits. Quantum circuits formed from qubits are the building blocks of a class of quantum computers. A promising implementation is solid-state qubits. Due to physical limitations and intrinsic material properties, such qubits suffer from static behavior, state leakage and are prone to external effects that limit the reliability for large scale computing architectures.

SUMMARY

Disclosed herein is a tunable quantum qubit circuit comprising: a plurality of interconnected Josephson tunneling junctions, a capacitive-coupled control gate, and independent control gates. The plurality of interconnected Josephson tunneling junctions are sculpted in-situ on-chip and each Josephson tunneling junction comprises a pair of high temperature superconductors separated by an active region having a controlled charge density. The capacitive-coupled control gate is operatively coupled to the Josephson tunneling junctions and is configured to simultaneously modulate energy levels of the Josephson tunneling junctions. The independent control gates are operatively coupled to the Josephson tunneling junctions. The independent control gates are reconfigurable on-the-fly by an operator.

The quantum qubit circuit may be tuned according to the following method steps. The first step provides for sculpting a plurality of interconnected Josephson tunneling junctions in-situ on-chip. Each Josephson tunneling junction comprises a pair of high temperature superconductors separated by an active region having a controlled charge density. The next step provides for simultaneously modulating energy levels of the Josephson tunneling junctions with a capacitive-coupled control gate. The next step provides for dynamically reconfiguring the quantum qubit circuit via independent control gates that are operatively coupled to corresponding Josephson tunneling junctions.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF SOME EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1A:
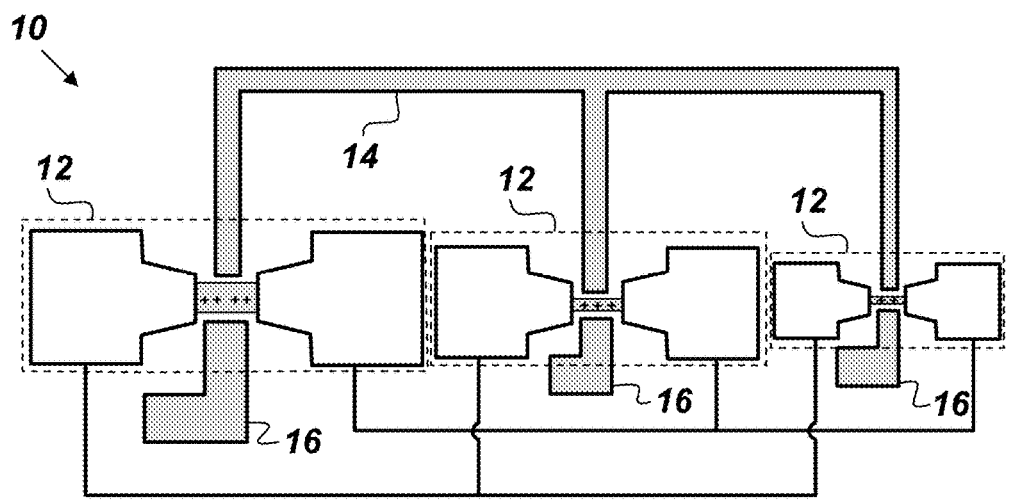
FIG. 1A is a top-view illustration of an embodiment of a tunable, quantum qubit circuit.

FIG. 1A is a top-view illustration of an example embodiment of a tunable quantum qubit circuit 10 that comprises, consists of, or consists essentially of a plurality of interconnected Josephson tunneling junctions 12, a capacitive-coupled control gate 14, and independent control gates 16. It is to be understood that while FIG. 1A depicts three interconnected Josephson tunneling junctions 12, the quantum qubit circuit 10 is not so limited, but may comprise any desired number of Josephson tunneling junctions. The plurality of Josephson tunneling junctions may comprise individual Josephson tunneling junctions 12 of various sizes.

Figure 1B:
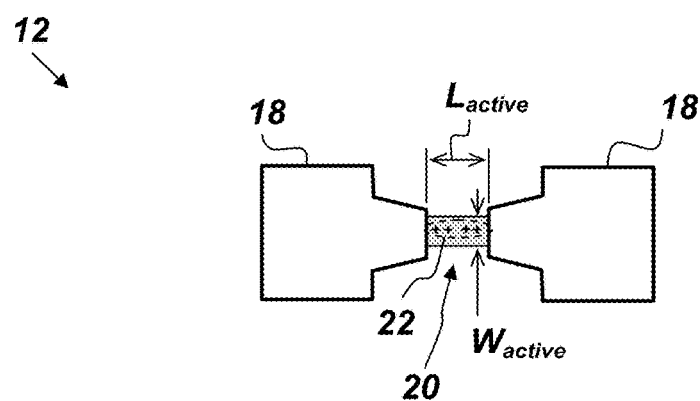
FIG. 1B is a top-view illustration of an embodiment of a Josephson junction.

FIG. 1B is a top-view illustration an individual Josephson tunneling junction 12 that may be produced with He ion beam nanolithography processes. The Josephson tunneling junction 12 may be sculpted in-situ on-chip and each Josephson tunneling junction 12 may comprise a pair of high temperature superconductors 18 separated by an active region 20, which has a controlled charge density, the charge densities is represented in FIG. 1B by plus signs 22 in the active region 20. The active regions of each of the Josephson tunneling junctions 12 in the quantum qubit circuit 10 may have differing charge densities. The capacitive-coupled control gate 14 may be operatively coupled to the Josephson tunneling junctions 12 and may be configured to simultaneously modulate energy levels of the Josephson tunneling junctions 12. The independent control gates 16 may be operatively coupled to the Josephson tunneling junctions 12 in any desired way including, but not limited to, capacitively, directly, and via close proximity placement so as to enable wave function overlap. The independent control gates 16 are reconfigurable on-the-fly by an operator. The high-temperature superconductors 18 shown in FIG. 1B are tapered toward the active region 20. However, it is to be understood that the high-temperature superconductors 18 may be in any desired shape. The plurality of interconnected Josephson tunneling junctions 12 may be variously sculpted to enable designing and tuning Hamiltonians in the field based on the sculpted Josephson tunneling junctions 12 and gating effects such that the quantum qubit circuit 10 may be tuned to perform different quantum computations.

The quantum qubit circuit 10 may be sculpted with any desired manufacturing process. Suitable examples of fabrication processes that may be used to sculpt the quantum quit circuit 10 include, but are not limited to, ion beam lithography, electron-beam lithography, and self-assembly. The quantum qubit circuit 10 may be made from materials including, but not limited to, sputtered/evaporated films as well emerging two-dimensional atomic crystals and heterostructures. The tunable quantum qubit circuit 10 may comprise built-in and internal memory/storage. The tunable quantum qubit circuit 10 may utilize quantization, charging effects and gate-control introduced with a nanofabrication process to tailor energy profiles. The tunable quantum qubit circuit 10 may provide for nonvolatile field-programmable configurations where quantum states can be created and reconfigured via gate-control coupling.

The tunable quantum qubit circuit 10 may be internally re-configured with nonvolatile behavior. An embodiment of the quantum qubit circuit 10 provides for a solid-state dynamically reconfigurable quantum computation/memory chip fabric and the underpinning quantum circuits, qubits and superconducting junction device structures. The Josephson tunneling junctions 12 may be sculpted on-chip with controllable nanoscale dimensions and with a precise in-situ incorporated charge density providing the designer the capability to add junctions dedicated to both computational or memory functions in the same lithography process within the identical circuit.

The active region 20 of each Josephson tunneling junction 12 is an active Cooper pair box region with the dimensions of $L_{active}$ and $W_{active}$ in the sub-10 nanometer (nm) regime. In other words, $L_{active}$ and $W_{active}$ are both less than 10 nm. In this size regime, quantization and charging effects modify the Cooper-pair box's electronic properties resulting in significant energy-level splitting ($E_n \sim 1/d^2$) and an increase of the Cooper pair Coulombic charging energy ($E_c \sim 2e^2/C$) to levels much greater than the thermal energy kT with expected well pronounced quantum oscillations. The tunable quantum qubit circuit 10 provides the necessary two-level qubit system for performing quantum computation and the tunable reconfigurability provides the ability to tailor-design the energy level properties for the desired functionality, speed, while setting the minimal leakage level. In addition, scaling of the Cooper pair box introduces band-structure modifications that results in sensitive nm-scale size tuning oscillations of the density of states, Josephson energy, and superconducting gap which are determinants of the overall basic superconducting properties, current/voltage response of the junctions and resiliency of the generated level system.

The quantum qubit circuit 10 enables the integration of superconductor/barrier/ionic/barrier/superconductor (SBIBS) heterostructure memory devices. The SBIBS memory devices technology may be integrated directly into the quantum qubit circuit 10 by introducing a controlled charge density in-situ to the active region 20 of the junctions during the device fabrication process enabling the write/erase/read functions based on reversible ionic separation/transport process to be conducted dynamically via the appropriate pulses generated from on-chip devices. By using large-scale numbers of custom quantum memories on a single chip combined with logical qubits quantum computers can be implemented.

Figure 2:
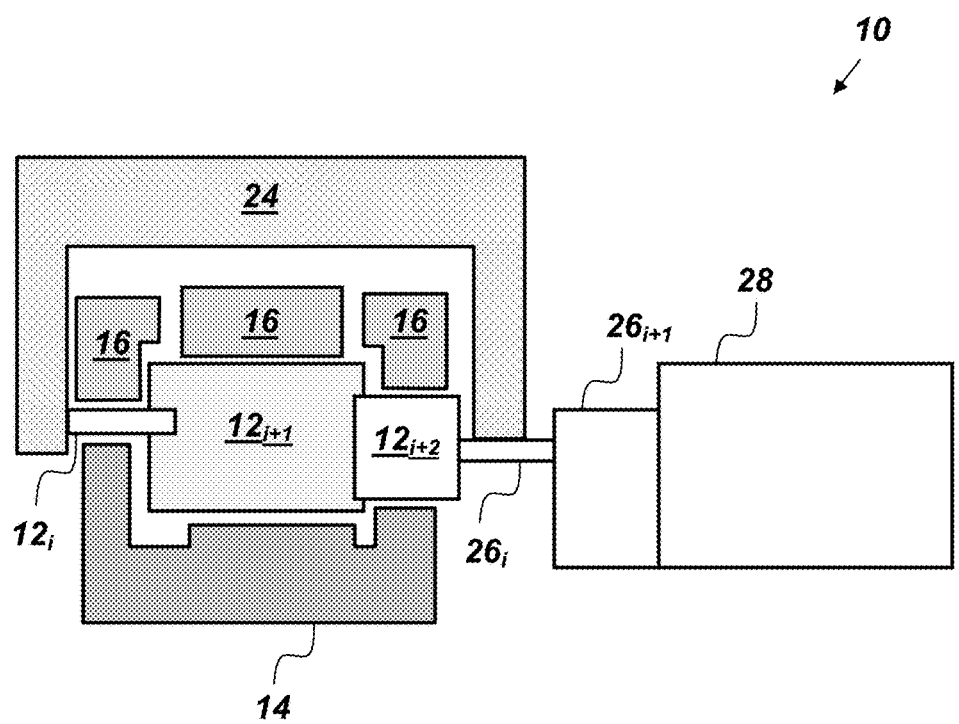
FIG. 2 is a top-view illustration of an embodiment of a tunable quantum qubit circuit.

FIG. 2 is a top-view illustration of an embodiment of the tunable quantum qubit circuit 10. The illustrated embodiment allows for on chip quantum circuits to be formed containing orders of magnitude of Josephson tunneling junctions 12 with a desired active size and charging energy to produce a particular energy profile or functionality (e.g. for computation or memory). FIG. 2 shows an embodiment of a quantum qubit-based circuit 10 comprising several (n) interconnected junctions 12 ($12_i$, $12_{i+1}$, . . . ) with gate controllable order parameters $\Delta_i$ and varying box size and charge density generating to first order a reconfigurable combined interaction energies $E_J$ represented for all the junction pairs as $E_J = \int d^3 r \Sigma_i^{n-1} \Delta_i^*(r) \Delta_{i+1}^*(r)$, where d is a derivative or partial derivative with respect to distance and r is a radial distance from a defined origin in the active box region. The unique interaction energies may be optimized for the optimal tunneling process (or Andreev reflections) and conducted with increased efficiency, reduced external leakage and other functionality as desired. Some of the interconnected junctions 12 are shown in FIG. 2 as overlapping; this is to suggest that the several components do not have to be monolithically fabricated. The various junctions could be made of separate elements and the overlapping regions may comprise mixed elements exhibiting desired characteristics. The embodiment of the tunable quantum qubit circuit 10 shown in FIG. 2 also comprises an optional reservoir 24 and optional nonvolatile memory junctions 26 designed for the purpose of facilitating the storing of a isolated or superposition of quantum states ||1>/|0> (e.g. utilizing the nonvolatile memory junctions 26 at the appropriate size scale and/or with the desired ionic modification for information state storage). The reservoir 24 may be used to input charge, Cooper pairs, fermions, photons, etc. into any desired component of the tunable quantum qubit circuit 10. The embodiment of the tunable quantum qubit circuit 10 shown in FIG. 2 also comprises a memory read out 28 coupled to the nonvolatile memory junctions 26.

The nonvolatile memory junctions 26 may be referred to as quantum memory and may be formed in-situ and integrated in close proximity to the plurality of interconnected Josephson tunneling junctions 12. As used herein, the term "close proximity" is understood to mean that the distance between the quantum memory and the plurality of interconnected Josephson tunneling junctions 12 is equal to or less than the quantum coherence length for which coupling can occur and such that there is no break in a crystal lattice between the quantum memory and the plurality of interconnected Josephson tunneling junctions 12. This could mean that the sculpted active region corresponding to memory functionality of a nonvolatile memory junction 26 is directly in contact and seamlessly transitions without break in the crystals lattice or in proximity with a break in crystal lattice but close enough where the quantum wave-functions overlap (i.e. at or less than the quantum coherence length for which coupling can occur).

Still referring to the embodiment of the quantum qubit circuit depicted in FIG. 2, the capacitive coupled control gate 14 may be used to simultaneously modulate the energy levels, or Hamiltonians, (Δδ) of all junctions $12_i$ in addition to independent gates 16 that allow an operator to dynamically reconfigure and create unlimited combinations of energy profiles as desired for facilitation and/or implementation of a particular state, quantum algorithm or encoding.

Figure 3:
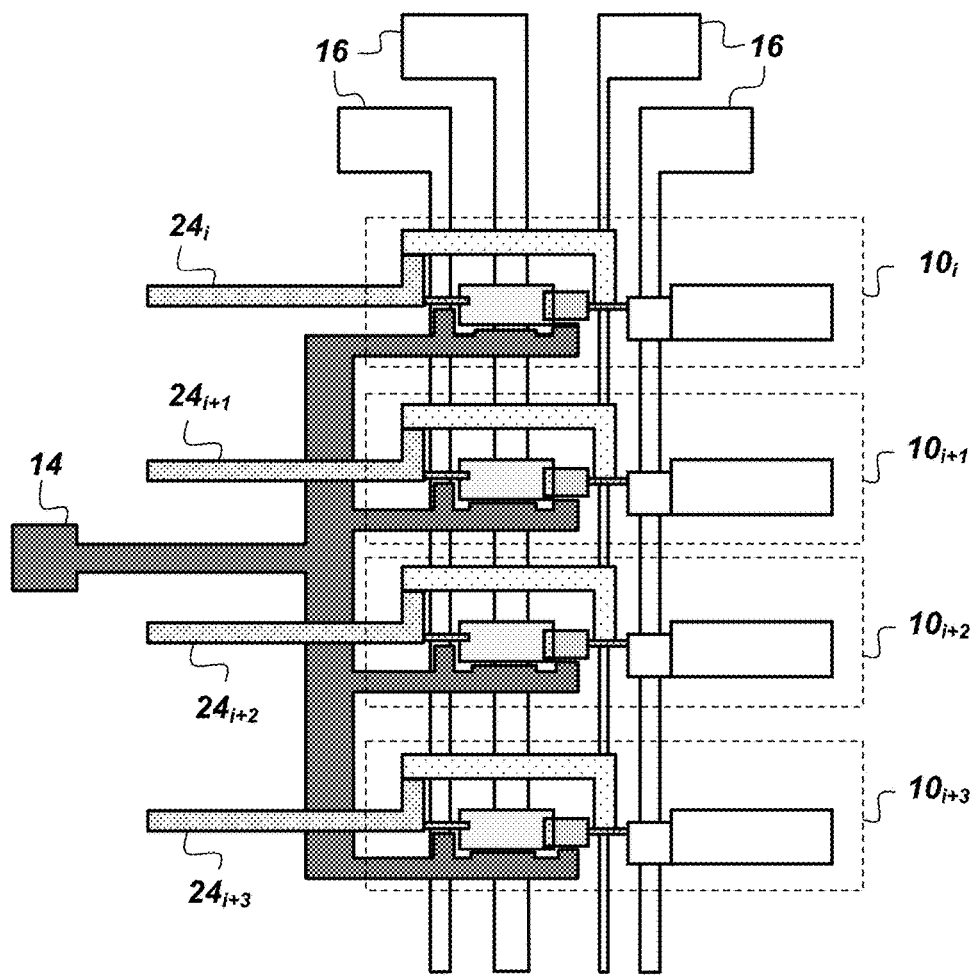
FIG. 3 is a top view of a multi-qubit embodiment having a plurality of tunable quantum qubit circuits.

FIG. 3 is a top view of a multi-qubit embodiment having a plurality of tunable quantum qubit circuits 10 ($10_i$, $10_{i+1}$, . . . ). The multi-qubit embodiment having a plurality of tunable quantum qubit circuits 10 may form a building block fabric of a quantum computer chip.

Figure 4:
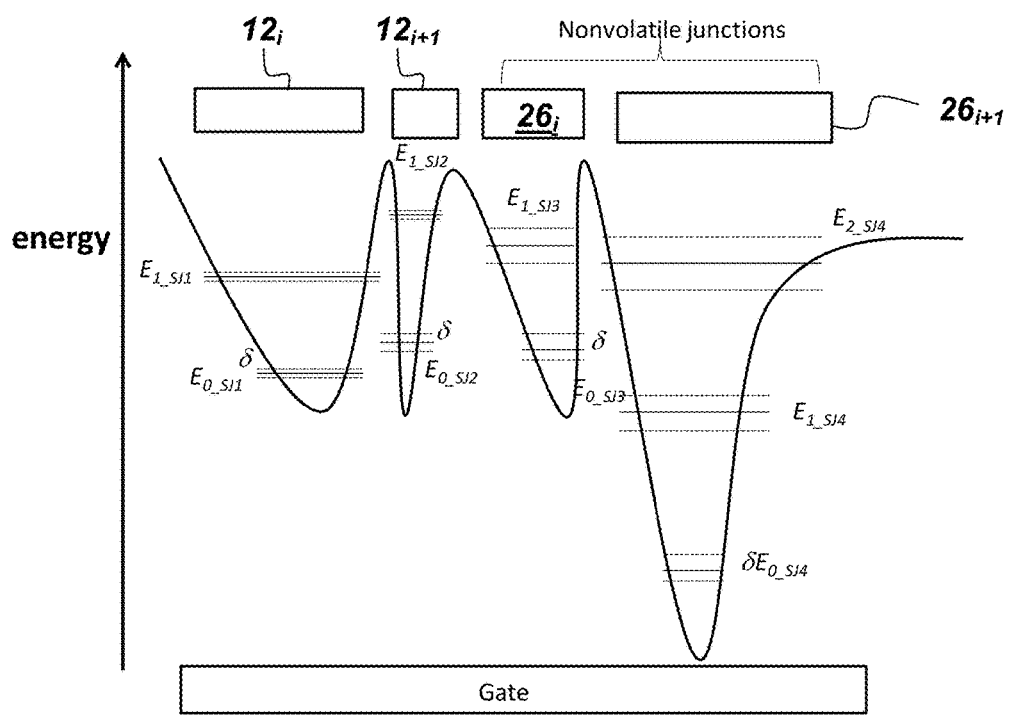
FIG. 4 is a graph demonstrating examples of expected configured energy profiles across several interconnected Josephson junctions.
Figure 5:
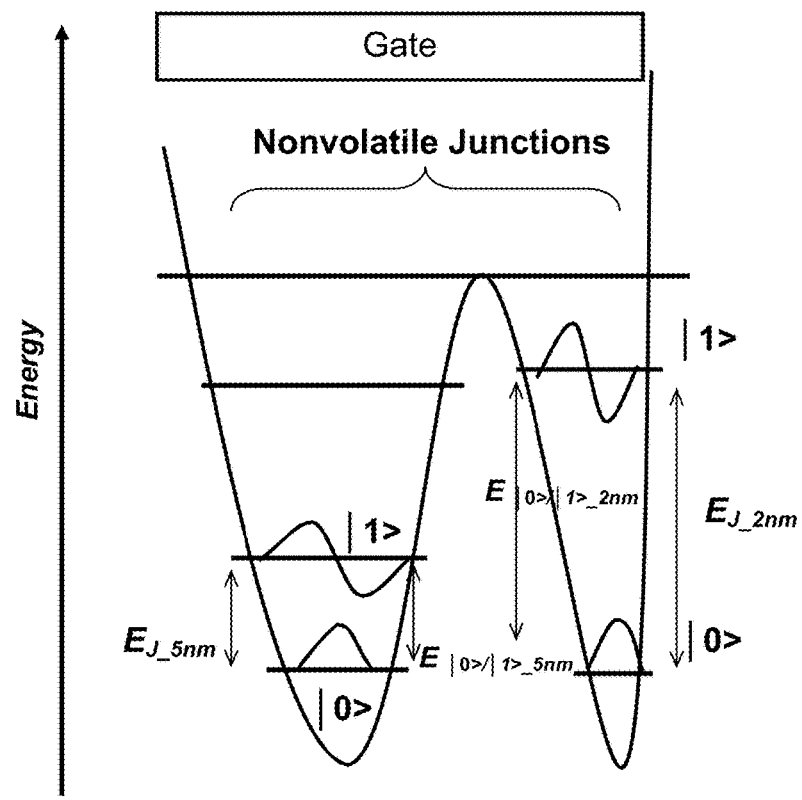
FIG. 5 is a graph demonstrating examples of expected configured energy profiles across several interconnected Josephson junctions.

FIGS. 4 and 5 are a graphs demonstrating examples of expected configured energy profiles across several interconnected junctions achieved in the embodiment with a junction capable of read-out inserted with a deep well specifically for quantum information state memory/storage during the coherence time duration of the states. The energy profiles $E_{1\_SJ1}$ and $E_{0\_SJ1}$ shown in FIG. 4 correspond with Josephson tunneling junction $12_1$ such as is depicted in FIG. 2. The energy profiles $E_{1\_SJ2}$ and $E_{0\_SJ2}$ FIG. 4 correspond with Josephson tunneling junction $12_{1+1}$ such as is depicted in FIG. 2. The energy profiles $E_{1\_SJ3}$ and $E_{0\_SJ3}$ FIG. 4 correspond with Josephson tunneling junction $26_1$ such as is depicted in FIG. 2. The energy profiles $E_{1\_SJ4}$ and $E_{0\_SJ4}$ FIG. 4 correspond with Josephson tunneling junction $26_{1+1}$ such as is depicted in FIG. 2.

Figure 6:
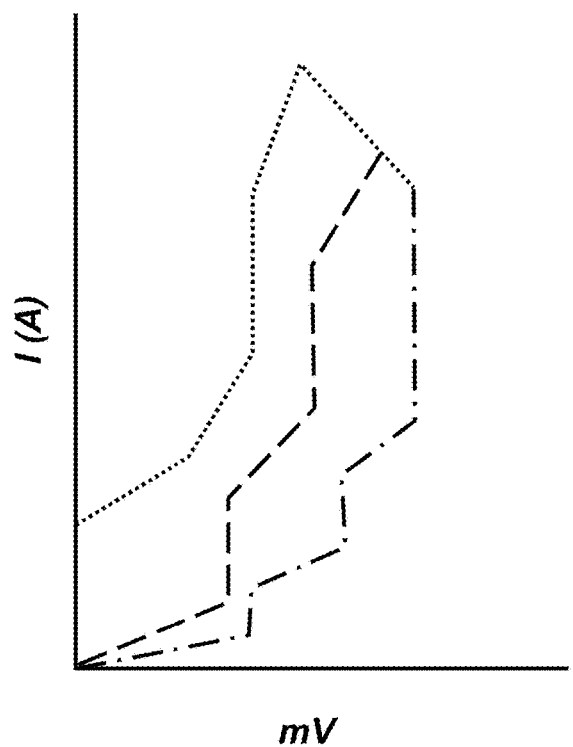
FIG. 6 is a graph showing expected current-voltage characteristics across a multi-junction embodiment of a tunable quantum qubit circuit.

FIG. 6 shows expected current-voltage characteristics across a multi junction with nonvolatile programming for a unique profile resulting in several resonances related to the individual junction tuning and its coupling strengths to adjacent junctions. The configured characteristics enable the designer to operate the quantum circuits in various regimes utilizing a combination and/or hybrid of charge, phase and flux effects. The dotted line represents the current-voltage characteristics resulting from the size and shape of the tunable quantum qubit circuit 10. The long-dashed line represents the current-voltage characteristics resulting from tuning the quantum qubit circuit 10 to a first degree by adjusting control gate 14 and the independent gates 16. The dot-dashed line represents the current-voltage characteristics resulting from further tuning the quantum qubit circuit 10 to a second degree by further adjusting control gate 14 and the independent gates 16.

Figure 7:
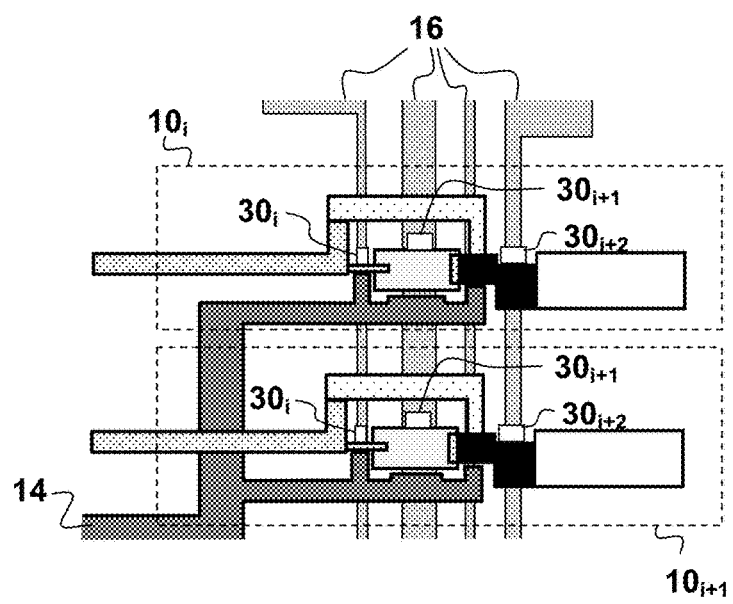
FIG. 7 is a multi-qubit circuit embodiment having a plurality of tunable quantum qubit circuits.

FIG. 7 is a multi-qubit embodiment having a plurality of tunable quantum qubit circuits 10 ($10_i$, $10_{i+1}$, . . . ), where each tunable quantum circuit 10 comprises control junctions 30 ($30_i$, $30_{i+1}$, . . . ) that can be inserted during the manufacturing process. The control junctions 30 function as the coupling junctions that interface between the active junctions (e.g., $12_i$, $12_{i+1}$, . . . & $26_i$, $26_{i+1}$, . . . ) and the gates 14 and 16. The use of the control junctions 30 serves to isolate the active junction environment thus minimizing leakage, error and environmental effects increasing the overall quantum coherence time allotted for performing the quantum computation/memory storage processes. The control junctions 30 may be used to limit environmental dissipation effects from control/program gates thereby increasing overall quantum coherence time. The appropriate coupling and energy profile for resilient purposes can be achieved by tuning the physical junction properties during fabrication and electronic tuning after fabrication. The vast flexibility in the design allows for achieving the standard set of universal quantum computation functions such as quantum-NOT/CNOT/SUM as well as other functions needed for the particular purpose. The tunable quantum qubit circuit 10 allows for the implementation of available algorithms such as Shor's algorithm in addition to others.

Figure 8:
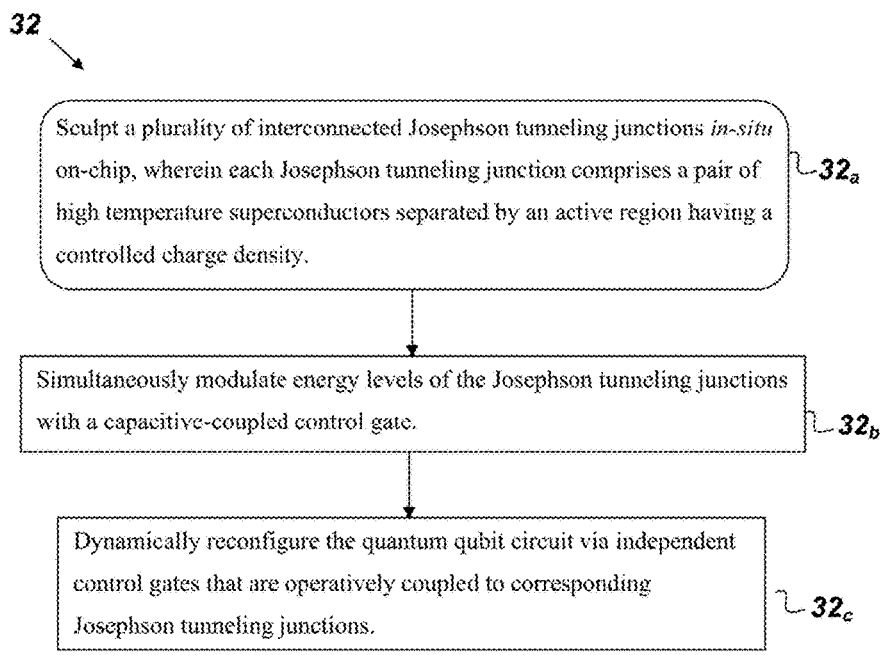
FIG. 8 is a process flowchart.

FIG. 8 is a flowchart illustrating the steps of a method 32 for tuning the quantum qubit circuit 10. Method 32 comprises the following steps. The first step $32_a$ provides for sculpting a plurality of interconnected Josephson tunneling junctions in-situ on-chip, wherein each Josephson tunneling junction comprises a pair of high temperature superconductors separated by an active region having a controlled charge density. The next step $32_b$ provides for simultaneously modulating energy levels of the Josephson tunneling junctions with a capacitive-coupled control gate. The next step $32_c$ provides for dynamically reconfiguring the quantum qubit circuit via independent control gates that are operatively coupled to corresponding Josephson tunneling junctions.

Method 32 may be modified by adding the step of tuning Hamiltonians of the quantum qubit circuit 10 after the quantum qubit circuit 10 has been fabricated by adjusting gating effects such that the quantum qubit circuit 10 may be tuned to perform different quantum computations.

The method of claim 15, further comprising the step of including Additional junctions (such as the nonvolatile memory junctions 26 scaled appropriately for information state storage) may be fabricated in close proximity to the Josephson tunneling junctions 12. Such additional junctions may be designed to store a superposition of different quantum states. The nonvolatile memory junctions 26 comprise active regions that may be ionically modified for information state storage. The nonvolatile memory junctions 26 may be modified with rare earth ions that are optically active such that the tunable quantum qubit circuit 10 is capable of optical read out.

From the above description of the tunable quantum qubit circuit 10, it is manifest that various techniques may be used for implementing the concepts of the tunable quantum qubit circuit 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the tunable quantum qubit circuit 10 is not limited to the particular embodiments described herein, but is capable of many embodiments without departing from the scope of the claims.

We claim:

1. A tunable quantum qubit circuit comprising:
   a plurality of interconnected Josephson tunneling junctions sculpted in-situ on-chip, wherein each Josephson tunneling junction comprises a pair of high temperature superconductors separated by an active region having a controlled charge density;
   a capacitive-coupled control gate operatively coupled to the Josephson tunneling junctions and configured to simultaneously modulate energy levels of the Josephson tunneling junctions; and
   independent control gates operatively coupled to the Josephson tunneling junctions, wherein the independent control gates are reconfigurable on-the-fly by an operator.

2. The quantum qubit circuit of claim 1, wherein the dimension of each active region is less than 10 nanometers.

3. The quantum qubit circuit of claim 2, wherein the plurality of Josephson tunneling junctions comprises Josephson tunneling junctions of various sizes.

4. The quantum qubit circuit of claim 3, wherein the active regions have differing charge densities.

5. The quantum qubit circuit of claim 4, wherein the controlled charge density enables write, erase, and read functions based on a reversible ionic separation process dynamically conducted via pulses generated on-chip.

6. The quantum qubit circuit of claim 4, wherein the controlled charge density is applied to each active region by in-situ ionic modification during fabrication.

7. The quantum qubit circuit of claim 1, wherein within each Josephson tunneling junction the high-temperature superconductors are tapered toward the active region.

8. The quantum qubit circuit of claim 1, wherein each active region is a Cooper pair box with dimensions of $L_{active}$ and $W_{active}$ in a sub-10 nanometer regime.

9. The quantum qubit circuit of claim 1, further comprising quantum memory formed in-situ and seamlessly integrated in close proximity to the plurality of interconnected Josephson tunneling junctions such that the distance between the quantum memory and the plurality of interconnected Josephson tunneling junctions is equal to or less than the quantum coherence length for which coupling can occur and such that there is no break in a crystal lattice between the quantum memory and the plurality of interconnected Josephson tunneling junctions.

10. The quantum qubit circuit of claim 9, wherein the plurality of interconnected Josephson tunneling junctions are variously sculpted to enable designing and tuning Hamiltonians in the field based on the sculpted Josephson tunneling junctions and gating effects such that the quantum qubit circuit may be tuned to perform different quantum computations.

* * * * *